(12) United States Patent  (10) Patent No.: US 8,890,572 B2
Joshi  (45) Date of Patent: Nov. 18, 2014

(54) LOW SWING DYNAMIC CIRCUIT (71) Applicant: Sachin Joshi, Fremont, CA (US)

(72) Inventor: Sachin Joshi, Fremont, CA (US)

(73) Assignee: Broadcom Corporation, Irvine, CA (US)

( * ) Notice: Subject to any disclaimer, the term of this patent is extended or adjusted under 35 U.S.C. 154(b) by 119 days.

(21) Appl. No.: 13/622,827

(22) Filed: Sep. 19, 2012

(65) Prior Publication Data

US 2014/0077840 A1    Mar. 20, 2014

(51) Int. Cl.
H03K 19/0185 (2006.01)
H03K 19/096 (2006.01)

(52) U.S. Cl.
USPC .............................. 326/95; 326/93; 326/112

(58) Field of Classification Search
USPC ................ 326/93, 95–98, 112, 119–122
See application file for complete search history.

(56) References Cited

U.S. PATENT DOCUMENTS

| | | | | |
|---|---|---|---|---|
| 6,765,410 B2 * | 7/2004 | Meneghini | | 326/52 |
| 7,034,576 B2 * | 4/2006 | Levy et al. | | 326/98 |
| 7,372,305 B1 * | 5/2008 | Ngo et al. | | 326/98 |

* cited by examiner

Primary Examiner — Daniel D Chang
(74) Attorney, Agent, or Firm — Sterne, Kessler, Goldstein & Fox P.L.L.C.

(57) ABSTRACT

Embodiments of the present disclosure enable low swing dynamic circuits with reduced dynamic power and leakage power. In an embodiment, a level detector circuit monitors the pre-charge voltage level of the dynamic node of a dynamic circuit and discontinues the charging of the dynamic node when the pre-charge voltage exceeds a logic high reference voltage. The logic high reference voltage is selected below a supply voltage of the dynamic circuit, resulting in a low swing dynamic circuit. In another embodiment, the pull-down logic circuitry is disconnected from the dynamic node when the dynamic node voltage falls below a logic low reference voltage, above a ground voltage. In another embodiment, a DC keeper circuit of the dynamic circuit is configured based on the pre-charge level of the dynamic node.

20 Claims, 6 Drawing Sheets

LOW SWING DYNAMIC CIRCUIT

BACKGROUND

1. Field the Invention

The field of the invention relates generally to dynamic circuits.

2. Background Art

Dynamic circuits have achieved widespread use in a variety of applications, including central processor units (CPUs), dynamic random access memories (DRAMs), and content-addressable memories (CAMs), for example. Dynamic circuits operate by storing a charge during a pre-charge phase and discharging or maintaining the charge in an evaluation phase to implement a logic function.

Dynamic circuits are typically faster and require less area than static circuits. However, in general, they have higher power consumption.

BRIEF DESCRIPTION OF THE DRAWINGS/FIGURES

The accompanying drawings, which are incorporated herein and form a part of the specification, illustrate the present disclosure and, together with the description, further serve to explain the principles of the disclosure and to enable a person skilled in the pertinent art to make and use the subject matter of the disclosure.

The present disclosure will be described with reference to the accompanying drawings. Generally, the drawing in which an element first appears is typically indicated by the leftmost digit(s) in the corresponding reference number.

DETAILED DESCRIPTION OF EMBODIMENTS

Figure 1:
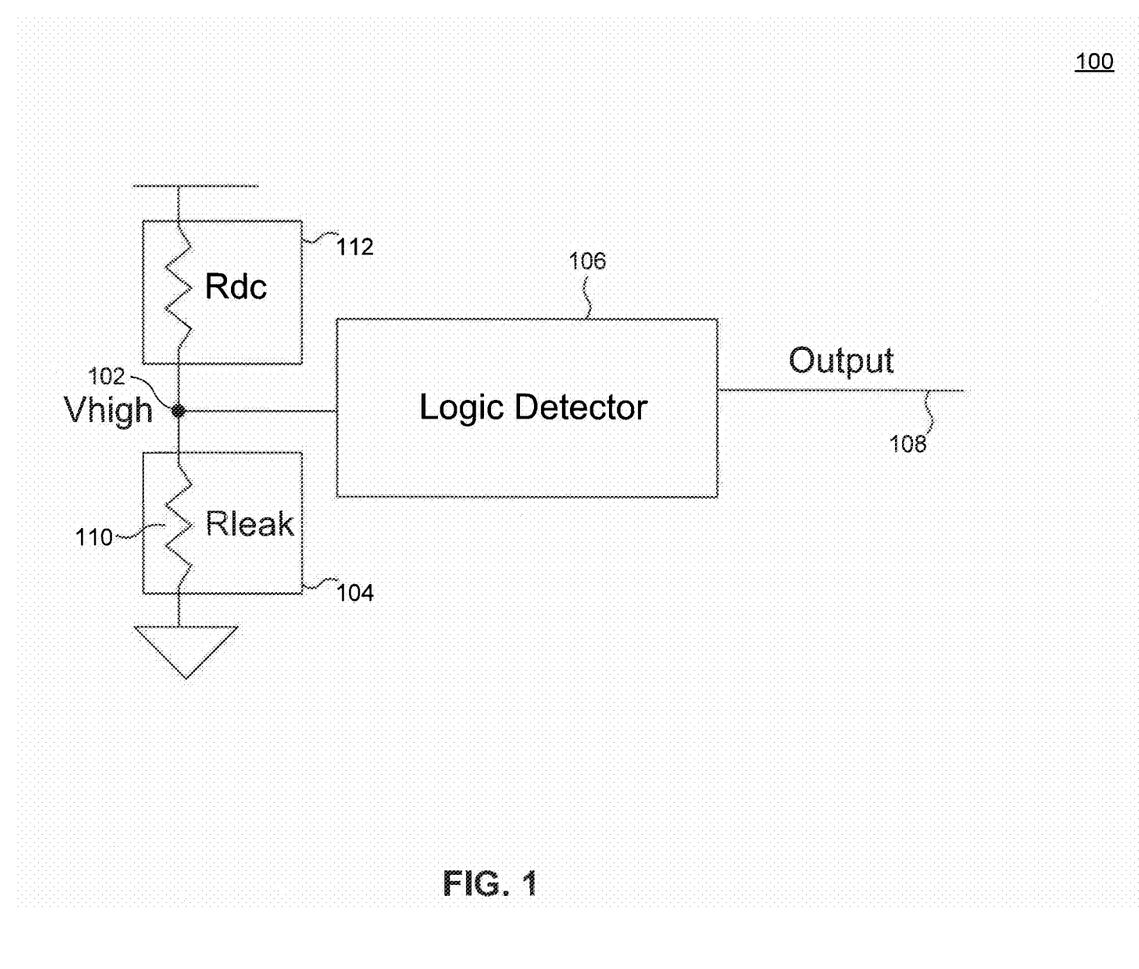
FIG. 1 is a block diagram of a dynamic circuit.

FIG. 1 is a block diagram of a dynamic circuit 100. As shown in FIG. 1, dynamic circuit 100 includes a dynamic node 102, pull-down logic circuitry 104, a logic detector 106, and DC keeper circuitry 112. Dynamic circuit 100 also includes charge circuitry (not shown in FIG. 1) for charging dynamic node 102 to a logic high voltage (Vhigh) during a pre-charge interval.

Pull-down logic circuitry 104 is not active during the pre-charge interval. In an evaluation interval, which follows the pre-charge interval, pull-down logic circuitry 104 is configured to receive input signals (not shown in FIG. 1). Based on the input signals, pull-down logic circuitry 104 either stays inactive, thereby dynamic node 102 remains at the logic high voltage, or becomes active and thus pulls dynamic node 102 down to a logic low voltage (e.g., ground). The dynamic power discharged when pull-down circuitry 104 becomes active is proportional to the difference between the logic high voltage and the logic low voltage.

Logic detector 106 is configured to sense dynamic node 102 during the evaluation interval and to generate an output 108 representative of the voltage level of dynamic node 102. For example, output 108 may be a logic high value (e.g., 1) when dynamic node 102 maintains the logic high voltage, and a logic low value (e.g., 0) when dynamic node 102 discharges to the logic low voltage.

Typically, even when not active, pull-down circuitry 104 may cause dynamic node 102 to discharge due to leakage through a leakage resistance 110. The leakage current/power through pull-down circuitry 104 is proportional to leakage resistance 110 and the voltage level of dynamic node 102. Specifically, the leakage current/power after the pre-charge interval is proportional to the logic high voltage (Vhigh) to which dynamic node 102 is charged in the pre-charge interval.

Leakage through pull-down circuitry 104 becomes problematic in the case that it is capable of discharging dynamic node 202 fast enough after pre-charge that a false detection results during the evaluation interval. For example, logic detector 106 can output a false logic low value if dynamic node 102 discharges due to leakage (before the evaluation interval) and not due to pull-down circuitry 104 becoming active during the evaluation interval.

DC keeper circuitry 112 helps lessen the above described leakage problem. As shown in FIG. 1, DC keeper circuitry 112 includes a pull-up resistance Rdc, which helps maintain dynamic node 102 at the logic high voltage after the pre-charge interval. More particularly, DC keeper circuitry 112 is configured such that it can resist the leakage of pull-down circuitry 104 from discharging dynamic node 102 after the pre-charge interval. At the same time, DC keeper circuitry 112 is configured such that it cannot resist pull-down circuitry 104 from pulling dynamic node 102 down when it becomes active during the evaluation interval.

Embodiments of the present disclosure, as further described below, recognize that both the dynamic power discharged when pull-down circuitry 104 becomes active and the leakage power are proportional to the pre-charge level (logic high voltage) of dynamic node 102. Accordingly, embodiments reduce the pre-charge level of dynamic node 102 (and additionally may increase the discharge level or logic low voltage of dynamic node 102) in order to enable reduced power low swing dynamic circuits. Further, embodiments recognize that the performance of DC keeper circuitry 112 is enhanced by having its pull-up resistance be inversely proportional to the pre-charge level of dynamic node 102 (the higher the pre-charge level, the lower the pull-up resistance, and vice versa). As such, embodiments control the DC keeper circuitry as a function of the pre-charge level of dynamic node 102 in order to compensate as necessary the leakage of pull-down circuitry 104. By doing so, the DC keeper circuitry does not dissipate more power than is necessary for it to maintain the pre-charge level of dynamic node 102.

Figure 2:
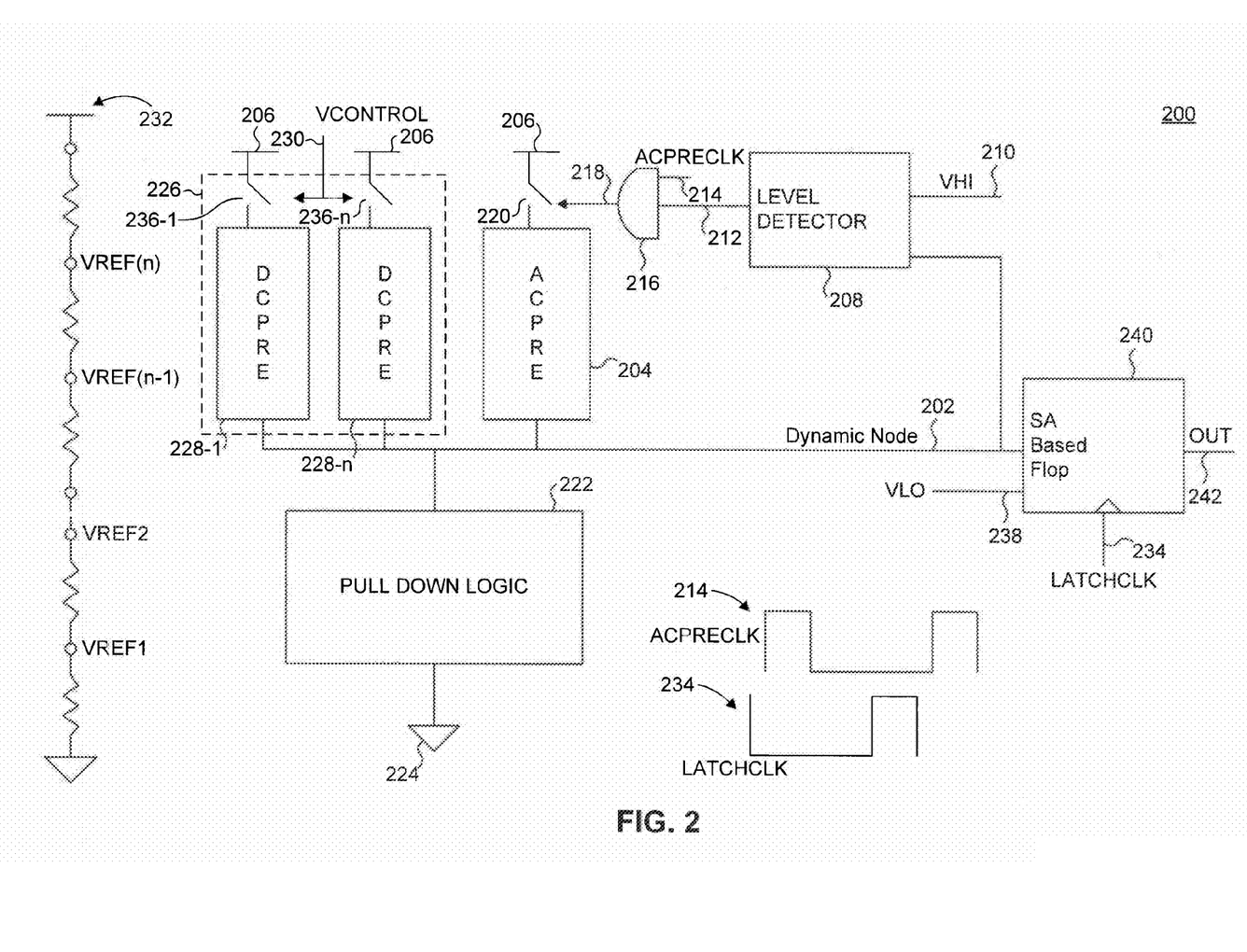
FIG. 2 illustrates an example dynamic circuit according to an embodiment of the present disclosure.

FIG. 2 illustrates an example dynamic circuit 200 according to an embodiment of the present disclosure. Example dynamic circuit 200 is provided for the purpose of illustration and is not limiting of embodiments of the present disclosure. As shown in FIG. 2, example dynamic circuit 200 includes, among other elements, a dynamic node 202, a first charge circuit (ACPRE) 204, a level detector circuit 208, pull-down logic circuitry 222, a second charge circuit 226, a reference voltage generator circuit 232, and a sense amplifier (SA)-based flip-flop 240.

In operation, first charge circuit 204 is configured to couple a supply node 206 to dynamic node 202 during a pre-charge interval of dynamic circuit 200. In an embodiment, the pre-charge interval corresponds in time to an ACPRE clock signal 214 being asserted. While dynamic node 202 is being charged, level detector circuit 208, which is coupled to dynamic node 202, is configured to monitor a voltage of dynamic node 202 and to control first charge circuit 204 based on the voltage of dynamic node 202.

In an embodiment, level detector circuit 208 is configured to control first charge circuit 204 to disconnect supply node 206 from dynamic node 202 when the voltage of dynamic node 202 reaches or exceeds a logic high reference voltage 210. More specifically, as shown in FIG. 1, level detector circuit 208 compares the voltage of dynamic node 202 and logic high reference voltage 210 to generate a comparison output 212. In an embodiment, output 212 is a logic high (e.g., 1) when the voltage of dynamic node 202 is below logic high reference voltage 210, and a logic low (e.g., 0) otherwise.

Output 212 is provided with ACPRE clock signal 214 to a logic AND gate 216 to produce control signal 218. As such, control signal 218 is a logic high only when both ACPRE clock signal 214 is asserted (which corresponds to the pre-charge interval) and output 212 is a logic high (the voltage of dynamic node 202 has not reached logic high reference voltage 210).

Control signal 218 controls a switch 220 to selectively couple supply node 206 to first charge circuit 204 and thus to selectively charge dynamic node 202. When control signal 218 is a logic high, switch 220 is closed, which couples supply node 206 to first charge circuit 204 and allows dynamic node 202 to be charged by supply node 206. When control signal 218 is a logic low, switch 220 is open, which disconnects supply node 206 from first charge circuit 204 and discontinues the charging of dynamic node 202.

In embodiments, logic high reference voltage 210 is programmable and can be selected from a plurality of reference voltages (VREF1, VREF2, . . . , VREF(n)) generated by reference voltage generator circuit 232. Alternatively, logic high reference voltage 210 can be generated by converting a digital signal to analog using a digital-to-analog converter. Depending on the selected value of logic high reference voltage 210, first charge circuit 204 may or may not couple supply node 206 to dynamic node 202 for the entire pre-charge interval. In an embodiment, to reduce the dynamic power and leakage power of dynamic circuit 200, logic high reference voltage 210 is selected to be below a supply voltage (Vdd) of supply node 206, resulting in a low swing dynamic circuit 200. Alternatively, logic high reference voltage 210 can be selected equal to Vdd, resulting in a rail-to-rail swing dynamic circuit 200.

Pull-down logic circuitry 222 is coupled between dynamic node 202 and a ground node 224. Pull-down logic circuitry 222 is not active during the pre-charge interval of dynamic circuit 200. In an evaluation interval, which follows the pre-charge interval, pull-down logic circuitry 222 is configured to receive input signals (not shown in FIG. 2), based on which pull-down logic circuitry 222 either stays inactive, thereby dynamic node 202 remains at its pre-charge level (e.g., the logic high reference voltage), or becomes active and thus discharges dynamic node 202 to a logic low voltage. In an embodiment, the evaluation interval corresponds in time to a LATCHCLK clock signal 234 being asserted.

In embodiments, the logic low voltage may be selected equal to a logic low reference voltage 238 higher than the ground voltage. Logic low reference voltage 238 is programmable and can be selected from a plurality of reference voltages (VREF1, VREF2, . . . , VREF(n)) generated by reference voltage generator circuit 232. When the logic low voltage is selected equal to logic low reference voltage 238, pull-down logic circuitry 222 is disconnected from dynamic node 202 when the voltage of dynamic node 202 falls below logic low reference voltage 238 and output 242 of SA-based flip-flop 240 has been latched. In an embodiment, the pull-down resistance of pull-down logic circuitry 222 is also increased once the voltage dynamic node 202 falls below reference voltage 238 until output 242 is latched. This further reduces the swing of dynamic circuit 200, resulting in further dynamic power and leakage power reduction.

SA-based flip-flop 240 is coupled to dynamic node 202 and receives logic low reference voltage 238. During the evaluation interval, LATCHCLK clock signal 234 is asserted and SA-based flip-flop 240 compares the voltage of dynamic node 202 and logic low reference voltage 238 to produce a comparison output 242. In an embodiment, output 242 is a logic low if the voltage of dynamic node 202 is below logic low reference voltage 238, and a logic high otherwise.

As described above, even when not active, pull-down logic circuitry 222 may cause dynamic node 202 to discharge due to leakage. Leakage through pull-down circuitry 222 becomes problematic in the case that it is capable of discharging dynamic node 202 below logic low reference voltage 238 before the evaluation interval is reached and output 242 is latched by LATCHCLK 234. In this case, SA-based flip-flop 240 could output a false logic low value even when Full-down circuitry 222 has not become active during the evaluation interval.

In example dynamic circuit 200, second charge circuit 226 is provided to lessen the above described leakage problem. Specifically, second charge circuit 226 is configured to couple supply node 206 to dynamic node 202 following the pre-charge interval (i.e., when first charge circuit 204 is no longer charging dynamic node 202). Further, second charge circuit 226 is configured such that an amount of charge delivered by second charge circuit 226 to dynamic node 202 compensates for a drop in the voltage of dynamic node 202 due to a leakage current of pull-down logic circuitry 222. As such, second charge circuit 226 helps maintain dynamic node 202 at (or around) logic high reference voltage 210 after the pre-charge interval until the evaluation interval is reached.

In another embodiment, second charge circuit 226 is further configured such that it cannot resist pull-down logic circuitry 222 from pulling dynamic node 202 down when it becomes active during the evaluation interval. Additionally, second charge circuit 226 is configured to disconnect supply node 206 from dynamic node 202 as soon as pull-down logic circuitry 222 discharges dynamic node 202 below logic low reference voltage 238.

In an embodiment, the performance of second charge circuit 226 is enhanced by configuring second charge circuit 226 such that the amount of charge delivered by second charge circuit 226 to dynamic node 202 is responsive to logic high reference voltage 210. As such, the pull-up resistance of second charge circuit 226 is configured as necessary to compensate the leakage of pull-down circuitry 226 (which is proportional to logic high reference voltage 210), without dissipating more than necessary power through second charge circuit 226.

Accordingly, in an embodiment, second charge circuit 226 is programmable based on logic high reference voltage 210. Specifically, as shown in FIG. 2, second charge circuit 226 includes a plurality of keeper circuits 228-1 to 228-n, each operable to couple supply node 206 to dynamic node 202. The pull-up resistance of second charge circuit 226 is inversely proportional to the number of keeper circuits 228 coupling supply node 206 to dynamic node 202. Example implementations of second charge circuit 226 are described below with reference to FIG. 3.

In an embodiment, a control bus 230 is used to vary the pull-up resistance or amount of charge delivered by second charge circuit 226 to dynamic node 202. As shown in FIG. 2, control bus 230 controls a plurality of switches 236-1 to 236-n, each operable to selectively couple a respective keeper circuit 228 to supply node 206. As such, control bus 230 controls which and how many of keeper circuits 228-1 to 228-n couple supply node 206 to dynamic node 202.

In an embodiment, control bus 230 is configured to control the coupling of at least one of the plurality of keeper circuits 228-1 to 228-n to supply node 206 based on logic high reference voltage 210. For example, control bus may be configured to couple at least one of the plurality of keeper circuits 228-1 to 228-n to supply node 206 when logic high reference voltage 210 is above a predetermined voltage, and to disconnect at least one of the plurality of keeper circuits 228-1 to 228-n from supply node 206 when logic high reference voltage 210 is below the predetermined voltage.

Figure 3:
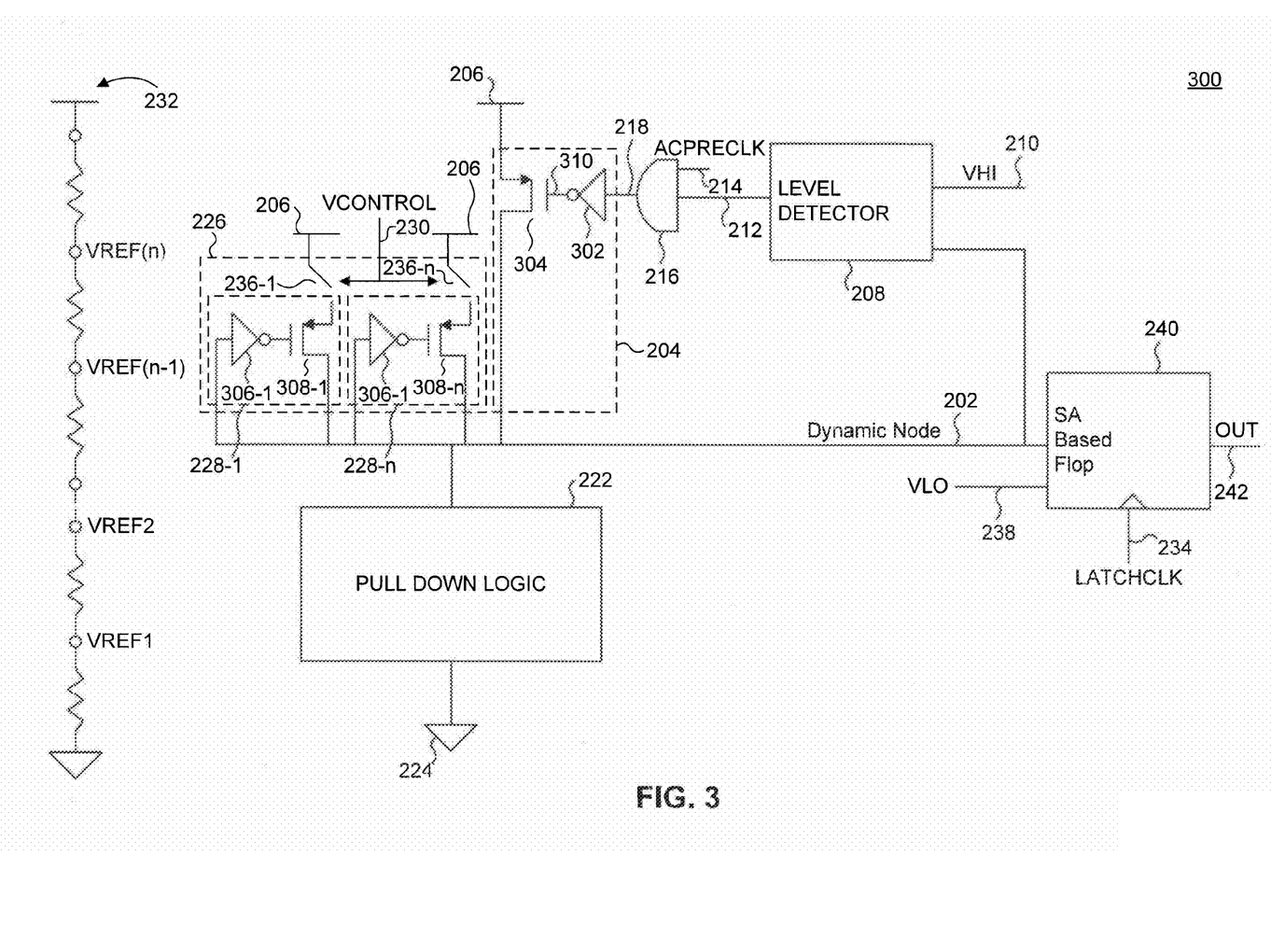
FIG. 3 illustrates another example dynamic circuit according to an embodiment of the present disclosure.

FIG. 3 illustrates another example dynamic circuit 300 according to an embodiment of the present disclosure. Example dynamic circuit 300 is provided for the purpose of illustration and is not limiting of embodiments of the present disclosure. Example dynamic circuit 300 includes similar elements as described above with respect to example dynamic circuit 200. For the purpose of illustration, these elements are referred to using the same numerals as used in FIG. 2 and are not described with reference to FIG. 3. Further, example dynamic circuit 300 illustrates example embodiments of first charge circuit 204 and of keeper circuits 228-1 to 228-n. As would be understood by a person of skill in the art, other implementations may be also be used for first charge circuit 204 and/or keeper circuits 228-1 to 228-n.

As shown in FIG. 3, first charge circuit 204 includes an inverter 302 and a P-type metal oxide semiconductor (MOS) transistor 304. Inverter 302 receives control signal 218 from AND gate 216 and inverts it to generate control signal 310. As described above, control signal 218 is a logic high only when both ACPRE clock signal 214 is asserted (which corresponds to the pre-charge interval) and output 212 of level detector circuit 208 is a logic high (the voltage of dynamic node 202 has not reached logic high reference voltage 210). In example dynamic circuit 300, this corresponds to control signal 310 being a logic low.

Control signal 310 controls the gate voltage of PMOS transistor 304, turning PMOS transistor 304 ON for logic low values and OF for logic high values. When PMOS transistor 304 is ON, supply node 206 is coupled to dynamic node 202. When PMOS transistor 304 is OFF, supply node 206 is disconnected from dynamic node 202.

Keeper circuits 228-1 to 228-n each includes an inverter 306 and a PMOS transistor 308. Inverter 306 is coupled between dynamic node 202 and a gate terminal of PMOS transistor 308. In an embodiment, the output of inverter 306 is a logic low when dynamic node 202 is charged to logic high reference voltage 210, and a logic high when dynamic node 202 discharges to logic low reference voltage 238 (or to ground voltage in another embodiment). As such, PMOS transistor 308 turns ON, coupling supply node 206 to dynamic node 202 when dynamic node 202 is charged to logic high reference voltage 210, and turns OFF disconnecting supply node 206 from dynamic node 202 when dynamic node 202 discharges to logic low reference voltage 238 (or to ground voltage in another embodiment) in the evaluation phase.

As in example dynamic circuit 200, control bus 230 is used to vary the pull-up resistance or amount of charge delivered by second charge circuit 226 to dynamic node 202 by controlling which and how many of keeper circuits 228-1 to 228-n couple supply node 206 to dynamic node 202. Additionally, in another embodiment, the gate bias voltages of PMOS transistors 308 can be adjusted based on logic high reference voltage 210 to increase or decrease the amount of charge delivered by each of keeper circuits 228-1 to 228-n to dynamic node 202.

In another embodiment, keeper circuits 228-1 to 228-n share a single inverter 306, which is coupled in the same manner as inverters 306-1 to 306-n in example circuit 300. In a further embodiment, a logic gate is used to turn on second charge circuit 226 once first charge circuit 204 is done charging dynamic node 202 (control signal 218 is a logic low) and to turn off second charge circuit 226 when either dynamic node 202 falls below logic low reference voltage 238 or output 242 is latched.

Figure 4:
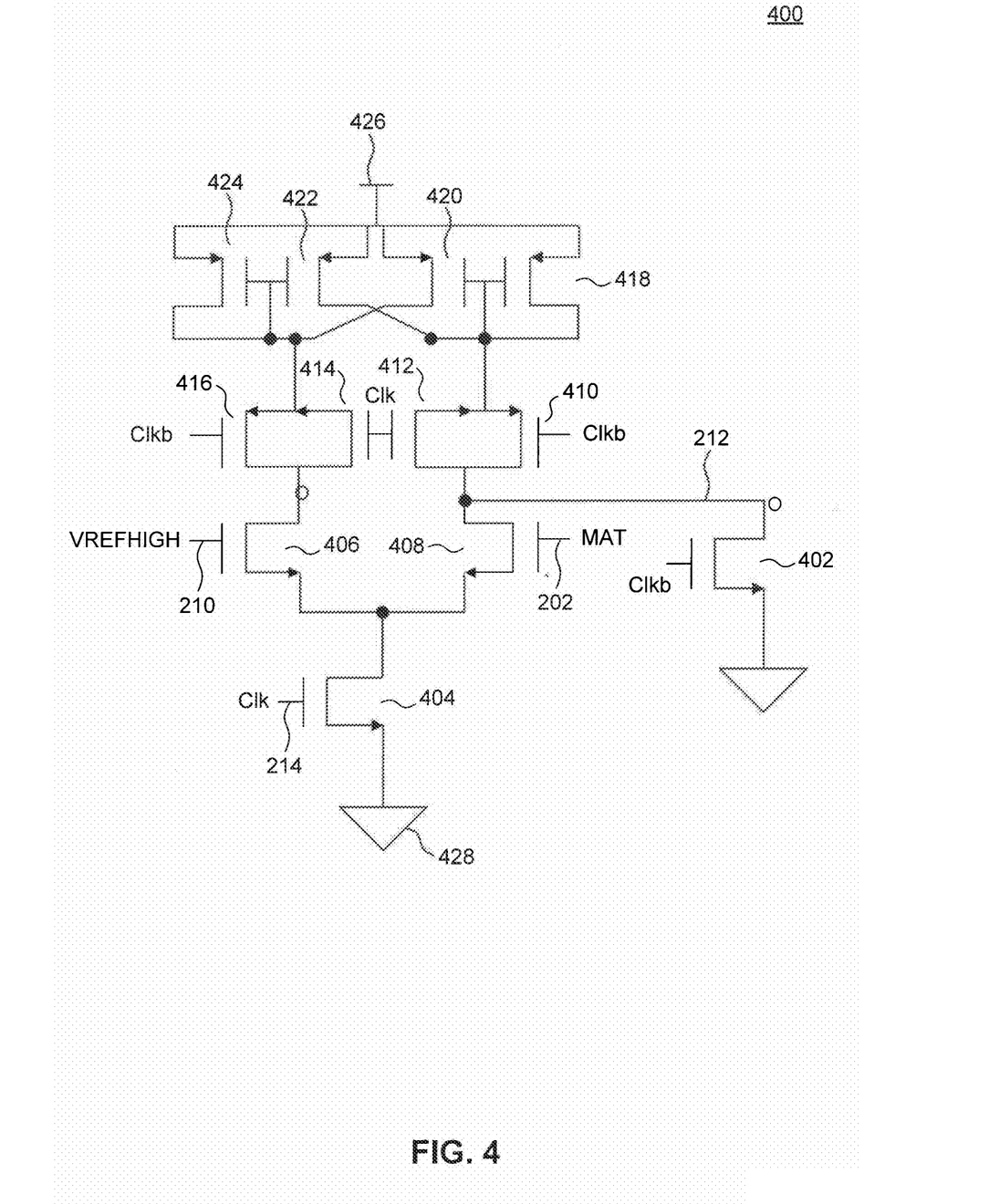
FIG. 4 illustrates an example level detector circuit according to an embodiment of the present disclosure.

FIG. 4 illustrates an example level detector circuit 400 according to an embodiment of the present disclosure. Example level detector circuit 400 is provided for the purpose of illustration and is not limiting of embodiments of the present disclosure. Example level detector circuit 400 may be an embodiment of level detector circuit 208 described above in FIG. 2. As shown in FIG. 4, level detector circuit 400 receives as inputs the voltage of dynamic node 202 and logic high reference voltage 210. Level detector circuit produces output 212. Output 212 is a logic high when the voltage of dynamic node 202 is lower than logic high reference voltage 210 and a logic low when the voltage of dynamic node 202 is greater than logic high reference voltage 210.

In operation, example level detector circuit 400 provides a continuous comparator of the voltage of dynamic node 202 and logic high reference voltage 210 when ACPRE clock signal 214 is asserted. Initially, when ACPRE clock signal 214 is not asserted, output 212 is pulled down to ground by a pull-down transistor 402 of circuit 400.

Subsequently, when ACPRE clock signal 214 is first asserted, a path is created between supply node 426 and output 212 via transistors 418, 422, 410, and 412, pulling output 212 to the supply voltage level. Once output 212 is pulled high, transistors 418 and 422 turn off Because the voltage of dynamic node 202 is still low at this time, transistor 408 remains off, preventing output 212 from discharging to ground. Logic high reference voltage 210 is a high voltage, which causes transistor 406 to turn on. This creates a first discharge path between supply node 426 and ground 428 via transistors 420, 424, 414, 416, 406, and 404.

As the voltage of dynamic node 202 increases and exceeds logic high reference voltage 210, a second discharge path is created between supply node 426 and ground 428 via transistors 418, 422, 410, 412, 408, and 404. This causes output 212 to discharge to ground voltage.

Figure 5:
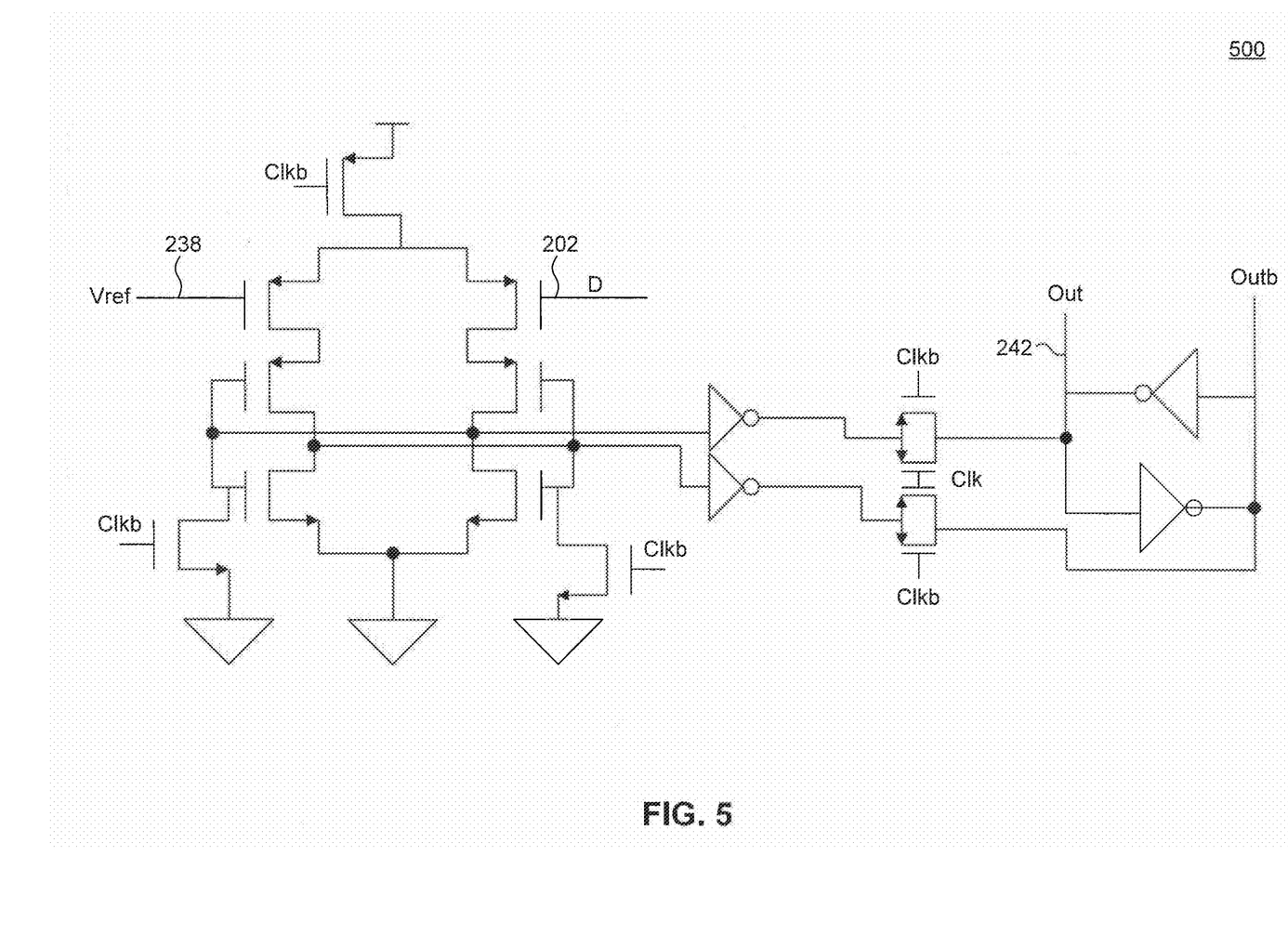
FIG. 5 illustrates an example sense amplifier-based flip-flop according to an embodiment of the present disclosure.

FIG. 5 illustrates an example sense amplifier (SA)-based flip flop 500 according to an embodiment of the present disclosure. Example SA-based flip flop 500 is provided for the purpose of illustration and is not limiting of embodiments of the present disclosure. Example SA-based flip flop 500 may be an embodiment of SA-based flip-flop 240 described above in FIG. 2.

As shown in FIG. 5, SA-based flip-flop 500 receives as inputs the voltage of dynamic node 202 and logic low reference voltage 238. SA-based flip-flop 500 produces output 242. Output 242 is a logic high when the voltage of dynamic node 202 is greater than logic low reference voltage 238, and a logic low when the voltage of dynamic node 202 is lower than logic low reference voltage 238. For rail-to-rail swing, logic low reference voltage 238 can be replaced with the complement of the voltage of dynamic node 202.

Figure 6:
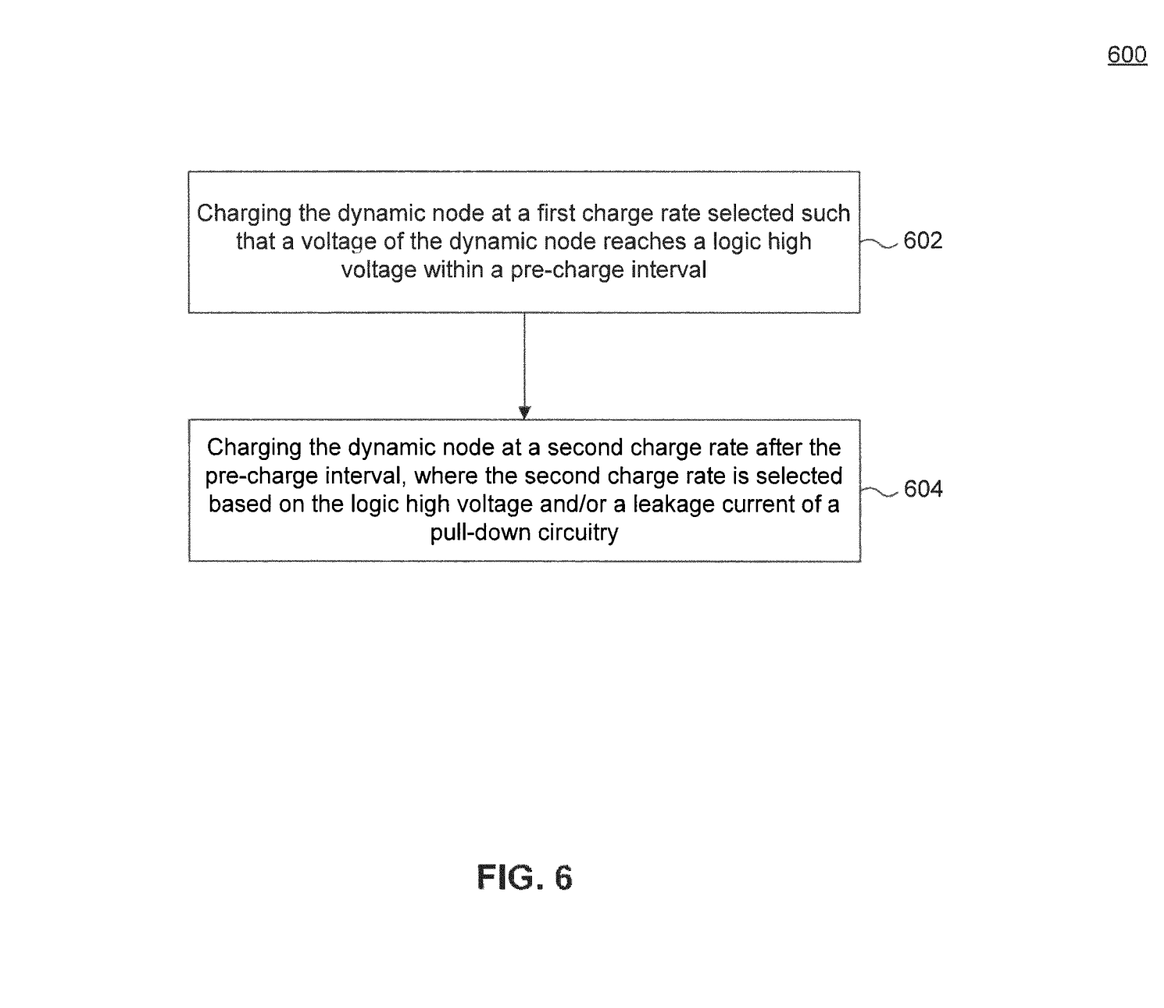
FIG. 6 is a process flowchart of a method of operating a dynamic circuit according to an embodiment of the present disclosure.

FIG. 6 is a process flowchart 600 of a method of operating a dynamic circuit according to an embodiment of the present disclosure. Process 600 may be performed in a dynamic circuit, such as example dynamic circuits 200 and 300, having a dynamic node and pull-down circuitry coupled to the dynamic node, and powered by a supply voltage.

As shown in FIG. 6, process 600 begins in step 602, which includes charging the dynamic node at a first charge rate selected such that a voltage of the dynamic node reaches a logic high voltage within a pre-charge interval. In an embodiment, step 602 is performed using a first charge circuit, such as charge circuit 204, and a level detector circuit, such as level detector circuit 208. In another embodiment, the logic high voltage is below the supply voltage, thereby resulting in a low swing dynamic circuit.

Subsequently, process 600 proceeds to step 604, which includes charging the dynamic node at a second charge rate after the pre-charge interval, where the second charge rate is selected based on the logic high voltage and/or a leakage current of the pull-down circuitry. In an embodiment, step 604 is performed using a second charge circuit, such as charge circuit 226. In another embodiment, the second charge rate is further selected to maintain the voltage of the dynamic node substantially at the logic high voltage after the pre-charge interval.

Embodiments have been described above with the aid of functional building blocks illustrating the implementation of specified functions and relationships thereof The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present disclosure should not be limited by any of the above-described exemplary embodiments, but should be defined only in accordance with the following claims and their equivalents.

What is claimed is:

1. A dynamic circuit, comprising:
   a dynamic node;
   a first charge circuit configured to couple a supply node to the dynamic node during a pre-charge interval; and
   a level detector circuit, coupled to the dynamic node, configured to compare a voltage of the dynamic node to a logic high reference voltage and to control the first charge circuit to disconnect the supply node from the dynamic node when the voltage of the dynamic node reaches or exceeds the logic high reference voltage.

2. The dynamic circuit of claim 1, wherein the logic high reference voltage is below a supply voltage of the supply node.

3. The dynamic circuit of claim 1, further comprising:
   pull-down logic circuitry, coupled to the dynamic node.

4. The dynamic circuit of claim 3, wherein a pull-down resistance of the pull-down logic circuitry is increased when the dynamic node falls below a logic low voltage.

5. The dynamic circuit of claim 3, further comprising:
   a second charge circuit configured to couple the supply node to the dynamic node following the pre-charge interval.

6. The dynamic circuit of claim 5, wherein the second charge circuit is further configured such that an amount of charge delivered by the second charge circuit to the dynamic node compensates for a drop in the voltage of the dynamic node due to a Leakage current of the pull-down logic circuitry.

7. The dynamic circuit of claim 5, wherein the second charge circuit comprises a plurality of keeper circuits, each operable to couple the supply node to the dynamic node.

8. The dynamic circuit of claim 7, further comprising:
   a control bus configured to control the coupling of at least one of the plurality of keeper circuits to the supply node based on the logic high reference voltage.

9. The dynamic circuit of claim 8, wherein the control bus is configured to disconnect said at least one of the plurality of keeper circuits from the supply node when the logic high reference voltage is below a predetermined voltage, and to couple said at least one of the plurality of keeper circuits to the supply node when the logic high reference voltage is above the predetermined voltage.

10. The dynamic circuit of claim 5, wherein the second charge circuit is configured to disconnect the supply node from the dynamic node when the pull-down logic circuitry discharges the dynamic node to a logic low voltage.

11. The dynamic circuit of claim 5, wherein a pull-up resistance of the second charge circuit is configurable based on the logic high reference voltage.

12. A dynamic circuit, comprising:
    a dynamic node;
    a first charge circuit configured to charge the dynamic node to a logic high voltage during a pre-charge interval;
    a level detector circuit configured to compare a voltage of the dynamic node to the logic high voltage and to control the first charge circuit to stop charging the dynamic node when the voltage of the dynamic node reaches or exceeds the logic high voltage;
    pull-down logic circuitry coupled to the dynamic node; and
    a second charge circuit configured to charge the dynamic node after the pre-charge interval, wherein the second charge circuit is further configured such that an amount of charge delivered by the second charge circuit to the dynamic node is responsive to the logic high voltage.

13. The dynamic circuit of claim 12, wherein the second charge circuit is further configured such that the amount of charge delivered by the second charge circuit to the dynamic node compensates for a voltage drop at the dynamic node due to a leakage current of the pull-down logic circuitry.

14. The dynamic circuit of claim 12, wherein the second charge circuit comprises a plurality of keeper circuits, each operable to couple a supply node to the dynamic node.

15. The dynamic circuit of claim 14, further comprising:
    a control bus configured to control coupling of at least one of the plurality of keeper circuits to the supply node based on the logic high voltage.

16. The dynamic circuit of claim 12, wherein the logic high reference voltage is below a supply voltage of a supply node.

17. A method of operating a dynamic circuit having a dynamic node and pull-down circuitry coupled to the dynamic node, the dynamic circuit powered by a supply voltage, comprising:

selectively charging the dynamic node during a pre-charge interval, wherein selectively charging the dynamic node comprises:
charging the dynamic node at a first charge rate, the first charge rate selected such that a voltage of the dynamic node reaches a logic high voltage within the pre-charge interval;
comparing the voltage of the dynamic node to the logic high voltage; and
discontinuing charging of the dynamic node when the voltage of the dynamic node reaches or exceeds the logic high voltage; and
charging the dynamic node at a second charge rate after the pre-charge interval, wherein the second charge rate is selected based on the logic high voltage and a leakage current of the pull-down circuitry.

18. The method of claim 17, wherein the second charge rate is further selected to maintain the voltage of the dynamic node substantially at the logic high voltage.

19. The method of claim 18, wherein the logic high voltage is below the supply voltage.

20. The method of claim 17, further comprising:
discontinuing charging of the dynamic node when the pull-down circuitry discharges the dynamic node to a logic low voltage.

* * * * *